United States Patent
Okonogi

Patent Number: 5,849,102
Date of Patent: Dec. 15, 1998

[54] METHOD OF CLEANING A SURFACE OF A SEMICONDUCTOR SUBSTRATE BY A HEAT TREATMENT IN AN INERT GAS ATMOSPHERE

[75] Inventor: Kensuke Okonogi, Tokyo, Japan

[73] Assignee: NEC Corporation, Tokyo, Japan

[21] Appl. No.: 808,169

[22] Filed: Feb. 28, 1997

[30] Foreign Application Priority Data

Feb. 28, 1996 [JP] Japan ................... 8-041151

[51] Int. Cl.⁶ ................... B08B 7/04
[52] U.S. Cl. ................... 134/19; 134/2; 134/3; 134/21; 134/902; 438/770; 438/906
[58] Field of Search ................... 134/2, 3, 19, 21, 134/902; 438/906, 770

[56] References Cited

U.S. PATENT DOCUMENTS

| | | | |
|---|---|---|---|
| Re. 30,412 | 10/1980 | Raychaudhuri | 136/255 |
| 3,647,535 | 3/1972 | Naber | 117/212 |
| 3,786,316 | 1/1974 | Kroger | 317/234 R |
| 3,871,912 | 3/1975 | Dierssen | 117/201 |
| 3,929,529 | 12/1975 | Poponiak | 148/191 |
| 3,941,647 | 3/1976 | Druminski | 156/612 |
| 4,096,622 | 6/1978 | MacIver | 29/578 |
| 4,282,270 | 8/1981 | Nozaki et al. | 427/93 |
| 4,345,000 | 8/1982 | Kawazoe et al. | 428/212 |
| 4,871,416 | 10/1989 | Fukuda | 156/635 |
| 5,030,319 | 7/1991 | Nishino et al. | 156/635 |
| 5,047,370 | 9/1991 | Yamamoto et al. | 437/248 |
| 5,244,843 | 9/1993 | Chau et al. | 437/239 |
| 5,264,297 | 11/1993 | Jindal et al. | 428/698 |
| 5,303,671 | 4/1994 | Kondo et al. | 118/719 |
| 5,344,493 | 9/1994 | Jackson | 134/1 |
| 5,422,305 | 6/1995 | Seabaugh et al. | 437/126 |
| 5,556,479 | 9/1996 | Bran | 134/1.3 |
| 5,563,092 | 10/1996 | Ohmi | 437/101 |
| 5,704,986 | 1/1998 | Chau et al. | 134/2 |

*Primary Examiner*—Robert Warden
*Assistant Examiner*—Sharidan Carrillo
*Attorney, Agent, or Firm*—Young & Thompson

[57] ABSTRACT

A method of cleaning a surface of a semiconductor comprising the steps of a) washing the semiconductor surface with chemicals to remove particles and metal impurities from the surface; b) inserting the semiconductor into a furnace that contains a gas mixture of nitrogen gas and a second inert gas; c) replacing the gas mixture with a third inert gas; d) heating the furnace containing the third inert gas for a predetermined period of time; and e) replacing the third inert gas in the furnace with oxygen and thermally oxidizing the surface of the semiconductor to form an oxide film on the surface.

4 Claims, 5 Drawing Sheets

METHOD OF CLEANING A SURFACE OF A SEMICONDUCTOR SUBSTRATE BY A HEAT TREATMENT IN AN INERT GAS ATMOSPHERE

BACKGROUND OF THE INVENTION

The present invention relates to a method of forming a semiconductor device, and more particularly to a method of cleaning a surface of a semiconductor substrate by a heat treatment.

In prior art, a surface of a silicon substrate has been cleaned in a chemical before a silicon oxide film is formed by a thermal oxidation on the cleaned surface of the silicon substrate. The silicon substrate surface has also been cleaned by chemicals before a polysilicon film or a silicon epitaxial layer is then formed on the cleaned surface of the silicon substrate. The cleaning by the chemicals is carried out to remove particles or heavy metal impurities from the surface of the silicon substrate. Actually, however, it is difficult to completely remove such particles or heavy metal impurities from the surface of the silicon substrate. Notwithstanding, it is required to completely clean the surface of the silicon substrate before the silicon oxide film or silicon layer is deposited thereon.

In order to try to satisfy the above requirement for completely cleaning the surface of the silicon substrate, it was proposed to carry out a heat treatment to the silicon substrate in a hydrogen atmosphere in a furnace so as to remove heavy metal impurities. This method is disclosed in the Japanese laid-open patent publication No. 4-68526. This heat treatment will be described in detail with reference to FIG. 1.

In the first step, a silicon substrate is cleaned with a chemical to remove particles and metal impurities from the surface of the silicon substrate.

In the second step, the silicon substrate is then placed in a furnace filled with an inert gas to prevent any growth of silicon oxide film on the surface of the silicon substrate.

In the third step, a hydrogen gas is introduced into the furnace so that the inert gas atmosphere is replaced into the hydrogen atmosphere. The silicon substrate remains in the inert gas atmosphere in the furnace for a predetermined time whereby the surface of the silicon substrate is cleaned with hydrogen. It may be possible to increase a temperature of the silicon substrate up to in the range of 400° C. to 1000° C. during the introduction of hydrogen into the furnace as the fourth step.

In the fifth step, after the necessary time for cleaning the substrate has been passed, the introduction of hydrogen into the furnace is discontinued. In the sixth step, an inert gas or a nitrogen gas is introduced into the furnace so that the furnace is filled with an inert gas atmosphere or a nitrogen atmosphere.

In the seventh step, an oxygen gas is introduced into the furnace so that the furnace is filled with an oxygen atmosphere.

In the eighth step, a thermal oxidation is carried out under predetermined conditions so that a silicon oxide film is formed on the surface of the silicon substrate.

As described above, in the prior art, the metal impurities have to be removed from the surface of the silicon substrate before a thermal oxidation is carried out to form the silicon oxide film on the surface of the silicon substrate.

On the other hand, if the silicon oxide film is formed by a low pressure chemical vapor deposition, the metal impurities also have to be removed from the surface of the silicon substrate before the low pressure chemical vapor deposition is carried out to form the silicon oxide film on the surface of the silicon substrate. In this case, the processes for cleaning the substrate and subsequent formation of the silicon oxide film are as follows.

In the first step, a silicon substrate is cleaned with a chemical to remove particles and metal impurities from the surface of the silicon substrate.

In the second step, the silicon substrate is then placed in a low pressure chemical vapor deposition furnace filled with an inert gas to prevent any growth of silicon oxide film on the surface of the silicon substrate.

In the third step, a hydrogen gas is introduced into the furnace so that the inert gas atmosphere is replaced into the hydrogen atmosphere. The silicon substrate remains in the inert gas atmosphere in the furnace for a predetermined time whereby the surface of the silicon substrate is cleaned with hydrogen. The temperature of the silicon substrate may be increased to in the range of 400° C. to 1000° C. during the introduction of hydrogen into the furnace as the fourth step.

In the fifth step, after the necessary time for cleaning the substrate has been passed, the introduction of hydrogen into the furnace is discontinued. In the sixth step, an inert gas or a nitrogen gas is introduced into the furnace so that the furnace is filled with an inert gas atmosphere or a nitrogen atmosphere.

In the seventh step, a reaction gas is introduced into the furnace so that the furnace is filled with a reaction gas atmosphere.

In the eighth step, a low pressure chemical vapor deposition is carried out under predetermined conditions so that a silicon oxide film is deposited on the surface of the silicon substrate.

For the above conventional method, it is important that the heat treatment to the silicon substrate is carried out in the hydrogen atmosphere to remove particles or metal impurities from the surface of the silicon substrate before the silicon oxide film is formed on the surface of the silicon substrate. This heat treatment in the hydrogen atmosphere raises the following problems.

Since hydrogen reacts with a small amount of oxygen to cause a combustion reaction, for which reason it is required to pay a great deal of attention to the reaction furnace and pipeline. Nevertheless, there is a possibility of explosion. In the light of safety management, the above method is not suitable for processing a large number of silicon substrates. In order to secure the safety, the processing system is made expensive.

The above second and sixth steps are necessarily required wherein the inert gas is introduced into the furnace before and after the hydrogen gas is introduced into the reaction chamber. Those result in increase in the number of the necessary processes. As a result, the manufacturing cost is increased.

Further, if the heat treatment to the silicon substrate is carried out in the hydrogen atmosphere, it is required to increase precipitation of oxygen inside the silicon substrate by increasing the bending of the silicon substrate or by lowering the mechanical strength of the silicon substrate. In the subsequent heat treatment to the silicon substrate, however, a large number of crystal defects such as slip dislocations is likely to appear in the silicon substrate. Such crystal defects result in reduction in yield of the semiconductor device formed on the silicon substrate.

In the above circumstances, it had been required to develop a novel method of cleaning a surface of a semiconductor substrate free from any problems as described above.

SUMMARY OF THE INVENTION

Accordingly, it is a primary object of the present invention to provide a novel method of cleaning a surface of a semiconductor substrate or a semiconductor layer free from any problems as described above.

It is a further object of the present invention to provide a novel method of cleaning a surface of a semiconductor substrate or a semiconductor layer, which is free from the requirement for using any expensive processing system.

It is a further object of the present invention to provide a novel method of cleaning a surface of a semiconductor substrate or a semiconductor layer, which is free from any increase in the number of processes.

It is yet a further object of the present invention to provide a novel method of cleaning a surface of a semiconductor substrate or a semiconductor layer, which is free from generation of any crystal defects such as slip dislocations.

The above and other objects, features and advantages of the present invention will be apparent from the following descriptions.

The present invention provides a method of cleaning a surface of a semiconductor substrate by subjecting the semiconductor substrate to a heat treatment in an atmosphere comprising at least any one of inert gases and a nitrogen gas.

BRIEF DESCRIPTIONS OF THE DRAWINGS

Preferred embodiments of the present invention will be described in detail with reference to the accompanying drawings.

DISCLOSURE OF THE INVENTION

The present invention provides a method of cleaning a surface of a semiconductor substrate by subjecting the semiconductor substrate to a heat treatment in an atmosphere comprising at least any one of inert gases and a nitrogen gas.

It is preferable that the atmosphere is an argon gas atmosphere.

It is also preferable that the atmosphere is a nitrogen gas atmosphere.

It is also preferable that the atmosphere is a helium gas atmosphere.

It is also preferable that the atmosphere is a mixture of at least two of the inert gases and the nitrogen gas.

It is also preferable that the atmosphere is a mixture of an argon gas and a nitrogen gas.

It is also preferable that the semiconductor substrate is a silicon substrate.

It is also preferable that the semiconductor substrate is a silicon-on-insulating substrate.

It is also preferable that the semiconductor substrate is a compound semiconductor substrate.

It is also preferable that the beat treatment is carried out after the surface of the semiconductor substrate is cleaned with chemicals.

It is also preferable that the heat treatment is carried out at a higher temperature than a temperature at which a film is formed on the surface of the semiconductor substrate.

The present invention also provides a method of cleaning a surface of a semiconductor layer by subjecting the semiconductor layer to a heat treatment in an atmosphere comprising at least any one of inert gases and a nitrogen gas.

It is preferable that the atmosphere is an argon gas atmosphere.

It is also preferable that the atmosphere is a nitrogen gas atmosphere.

It is also preferable that the atmosphere is a helium gas atmosphere.

It is also preferable that the atmosphere is a mixture of at least two of the inert gases and the nitrogen gas.

It is also preferable that the atmosphere is a mixture of an argon gas and a nitrogen gas.

It is also preferable that the semiconductor layer is a silicon layer.

It is also preferable that the semiconductor layer is a silicon-on-insulating layer.

It is also preferable that the semiconductor layer is a compound semiconductor layer.

It is also preferable that the heat treatment is carried out after the surface of the semiconductor layer is cleaned with chemicals.

It is also preferable that the heat treatment is carried out at a higher temperature than a temperature at which a film is formed on the surface of the semiconductor layer.

PREFERRED EMBODIMENTS

Figure 1:
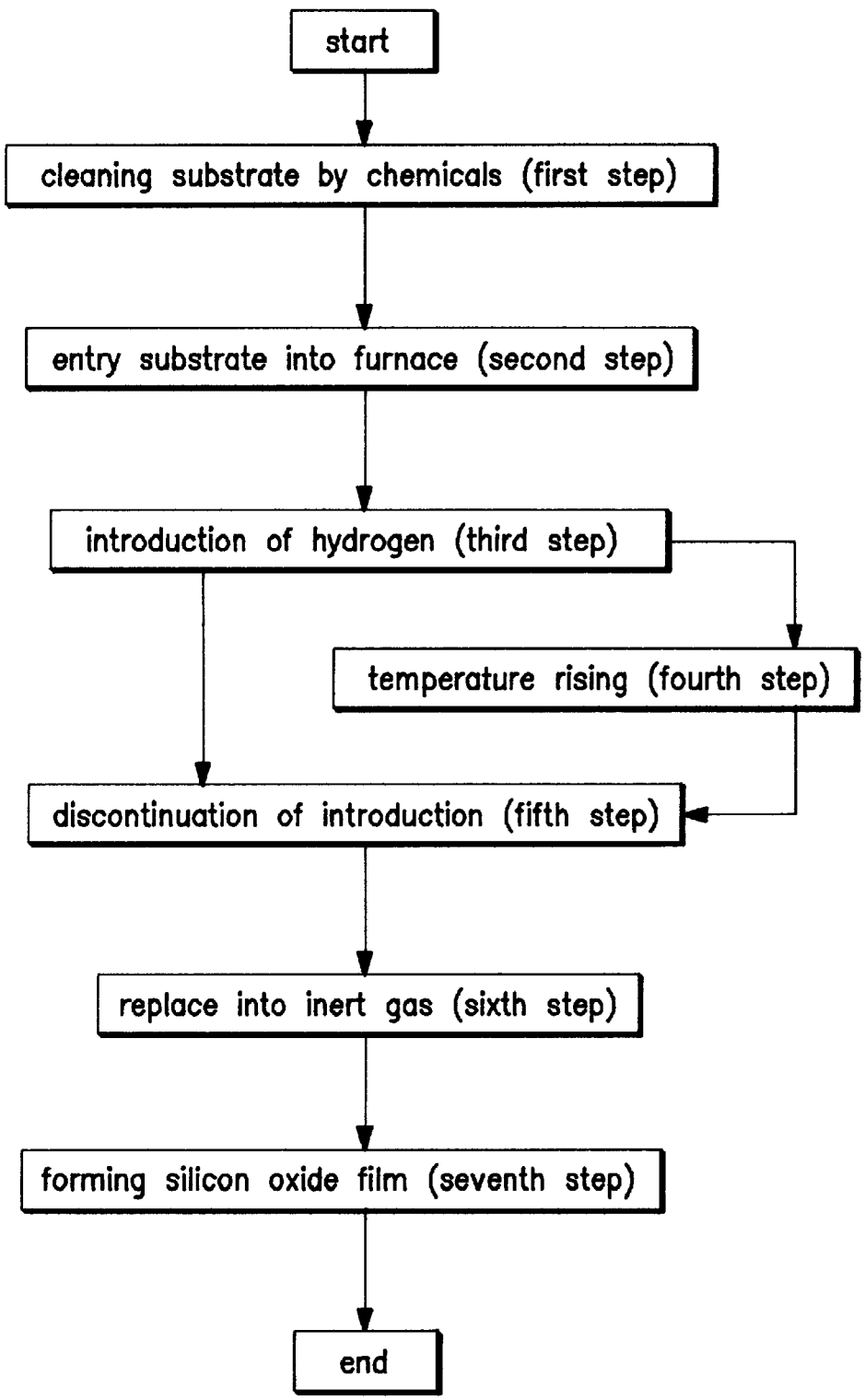
FIG. 1 is a flow chart illustrative of the conventional method of cleaning the surface of the silicon substrate.
Figure 2:
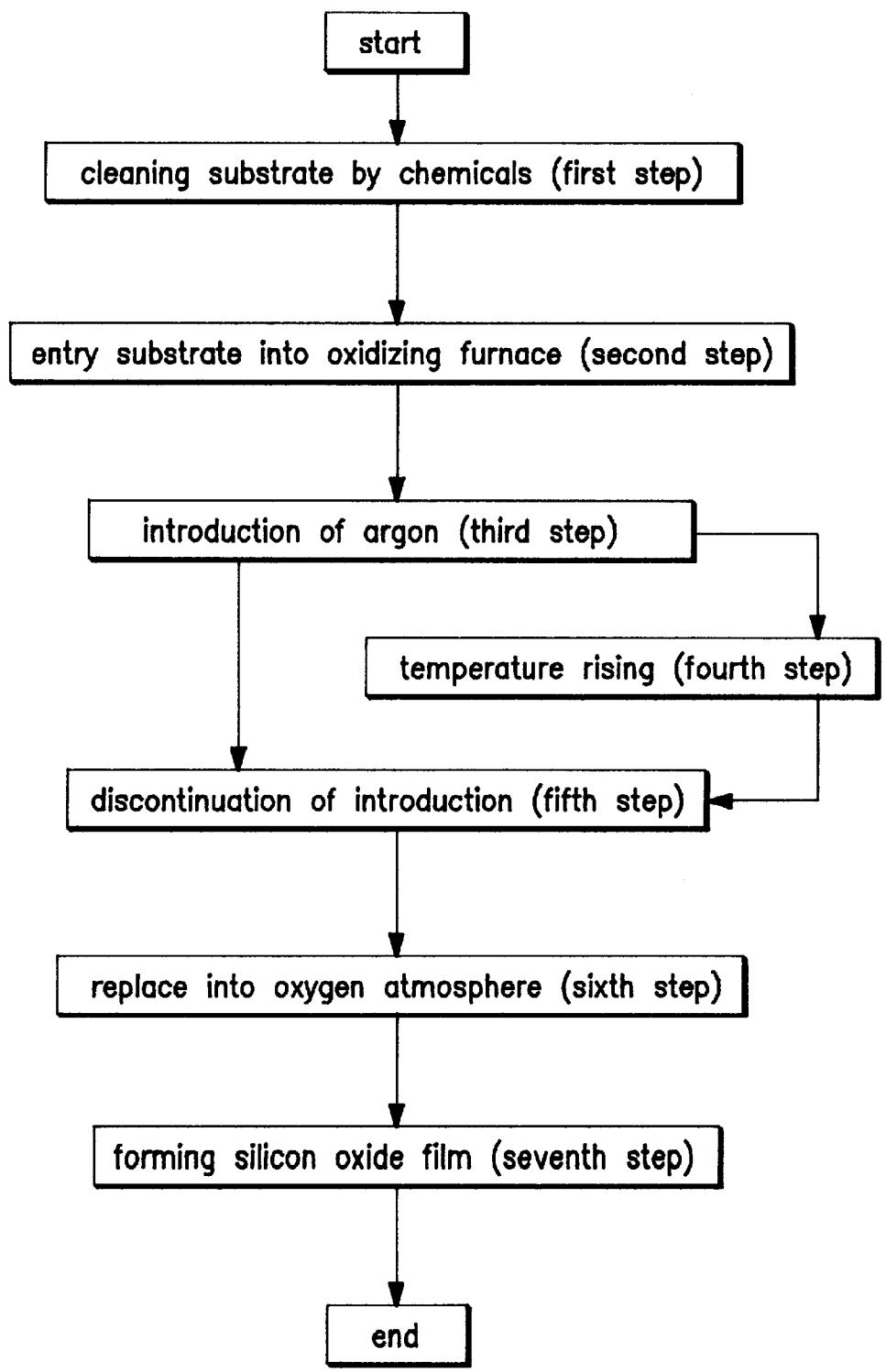
FIG. 2 is a flow chart illustrative of a novel method of cleaning the surface of the silicon substrate in a first embodiment according to the present invention.

A first embodiment according to the present invention will be described in detail with reference to FIG. 2, wherein a novel method of cleaning a surface of a silicon substrate before a thermal oxidation is carried out to form a silicon oxide film on the surface of the silicon substrate.

In the first step, a silicon substrate such as a silicon-on-insulating substrate is cleaned with chemicals. As the chemicals, hydrofluoric acid solution, a solution including hydrochloric acid and hydrogen peroxide, and a solution including ammonia water and hydrogen peroxide water. The cleaning by use of the chemicals removes a majority of particles and metal impurities from the surface of the silicon substrate.

In the second step, the silicon substrate is placed in an oxidizing furnace filled with an inert gas to prevent any silicon oxide film from being grown on the surface of the silicon substrate. Introductions of both the nitrogen gas and the argon gas are continued. As an inert gas, a nitrogen gas including a slight amount of argon gas is used. The oxidizing furnace is maintained at a temperature of 800° C.

In the third step, the introduction of nitrogen gas into the furnace is discontinued whilst the introduction of argon gas thereinto is maintained so that the atmosphere in the furnace is placed into an argon gas atmosphere. The silicon substrate remains placed in the argon gas atmosphere in the furnace for a predetermined time, for example, 20 minutes at the temperature of 800° C. for the purpose of cleaning the surface of the silicon substrate. Alternatively, it is possible to increase the temperature of the silicon substrate up to 900° C. as the fourth step.

In the fifth step, after the necessary time predetermined has been passed, then the introduction of argon gas into the furnace is discontinued.

In the sixth step, an oxygen gas is introduced into the oxidizing furnace so that the atmosphere in the furnace is replaced into the oxygen atmosphere.

In the seventh step, a thermal oxidation is carried out to form a silicon oxide film on the surface of the silicon substrate. If the temperature has not been increased, the temperature of the silicon substrate remains at 800° C. during replacement of the argon gas atmosphere into the oxygen atmosphere. If, however, the temperature has been increased in the above fourth step, the temperature of the silicon substrate remains at 900° C. during replacement of the argon gas atmosphere into the oxygen atmosphere.

According to the above first embodiment, it is possible to process a large number of silicon substrates by the inexpensive oxidizing furnace safely.

The above novel method of cleaning the surface of the silicon substrate allows a reduction in the number of the processes, resulting in a reduction in the manufacturing cost.

The above novel method of cleaning the surface of the silicon substrate is further free from the problem with the generation of crystal defects such as slip dissociation in the silicon substrate.

The above novel method of cleaning the surface of the silicon substrate facilitates cleaning the surface of the silicon-on-insulating substrate or facilitates removal of heavy metal from the surface of the silicon-on-insulating substrate.

Figure 3:
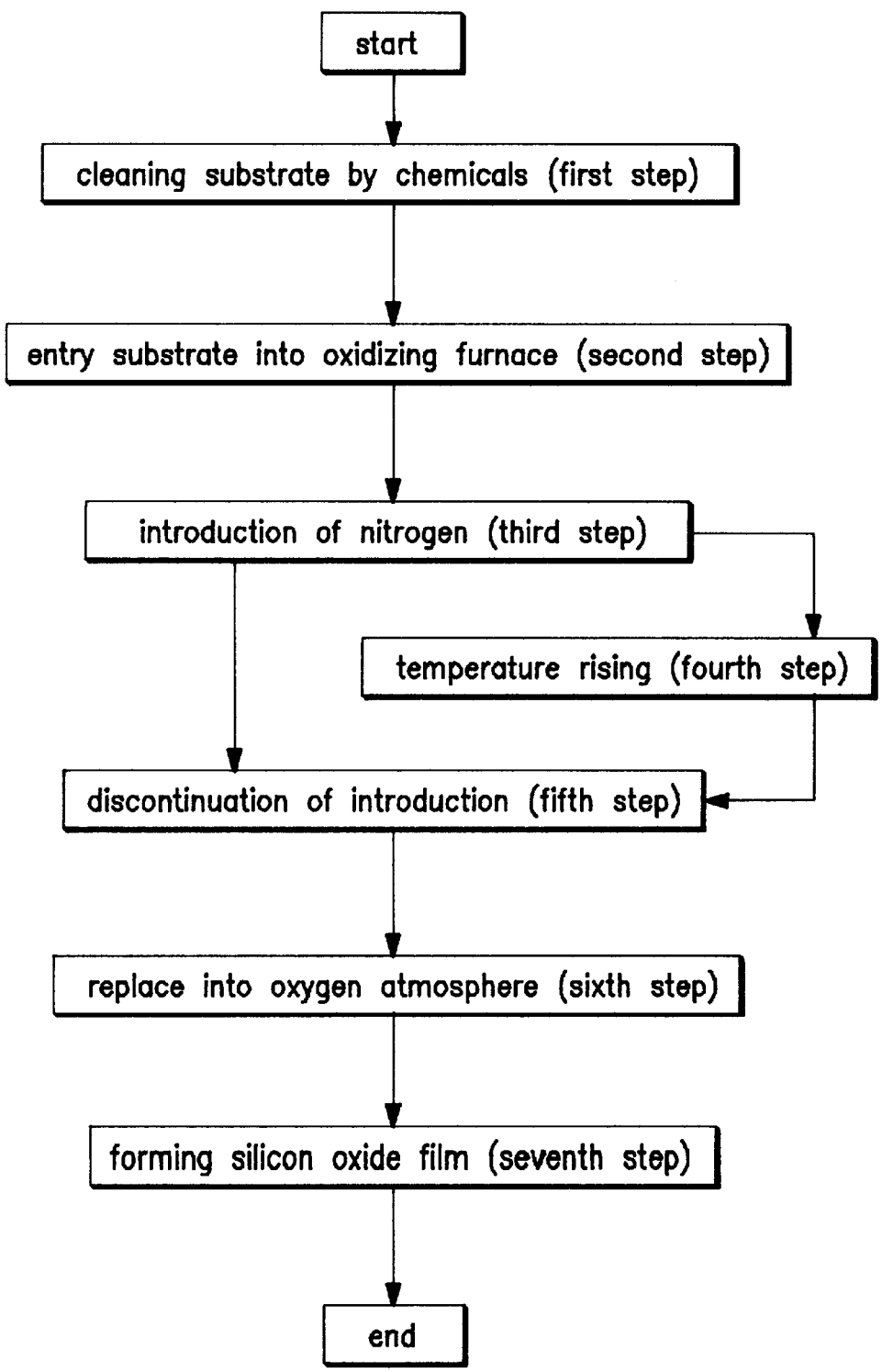
FIG. 3 is a flow chart illustrative of a novel method of cleaning the surface of the silicon substrate in a second embodiment according to the present invention.

A second embodiment according to the present invention will be described in detail with reference to FIG. 3, wherein a novel method of cleaning a surface of a silicon substrate before a thermal oxidation is carried out to form a silicon oxide film on the surface of the silicon substrate.

In the first step, a silicon substrate such as a silicon-on-insulating substrate is cleaned with chemicals. As the chemicals, hydrofluoric acid solution, a solution including hydrochloric acid and hydrogen peroxide, and a solution including ammonia water and hydrogen peroxide water. The cleaning by use of the chemicals removes majority of particles and metal impurities from the surface of the silicon substrate.

In the second step, the silicon substrate is placed in an oxidizing furnace filled with a nitrogen gas to prevent any silicon oxide film from being grown on the surface of the silicon substrate. Introduction only of the nitrogen gas is continued. The oxidizing furnace is maintained at a temperature of 700° C.

In the third step, the introduction of nitrogen gas into the furnace is continued so that the nitrogen atmosphere in the furnace is maintained. The silicon substrate remains placed in the nitrogen atmosphere in the furnace for a predetermined time, for example, 30 minutes at the temperature of 700° C. for the purpose of cleaning the surface of the silicon substrate. Alternatively, it is possible to increase the temperature of the silicon substrate up to 800° C. as the fourth step.

In the fifth step, after the necessary time predetermined has been passed, then the introduction of nitrogen gas into the furnace is discontinued.

In the sixth step, an oxygen gas is introduced into the oxidizing furnace so that the atmosphere in the furnace is replaced into the oxygen atmosphere.

In the seventh step, a thermal oxidation is carried out to form a silicon oxide film on the surface of the silicon substrate. If the temperature has not been increased, the temperature of the silicon substrate remains at 700° C. during replacement of the argon gas atmosphere into the oxygen atmosphere. If, however, the temperature has been increased in the above fourth step, the temperature of the silicon substrate remains at 800° C. during replacement of the argon gas atmosphere into the oxygen atmosphere.

According to the above second embodiment, it is possible to process a large number of silicon substrates by the inexpensive oxidizing furnace safely.

The above novel method of cleaning the surface of the silicon substrate allows a reduction in the number of the processes, resulting in a reduction in the manufacturing cost.

The above novel method of cleaning the surface of the silicon substrate is further free from the problem with the generation of crystal defects such as slip dissociation in the silicon substrate.

The above novel method of cleaning the surface of the silicon substrate facilitates cleaning the surface of the silicon-on-insulating substrate or facilitates removal of heavy metal from the surface of the silicon-on-insulating substrate.

Differently from the first embodiment, in the second embodiment, the temperature of the furnace processing is set as low as possible in view of prevention of any silicon nitride film on a silicon substrate. If the temperature of the furnace processing is so high, then any silicon nitride film may be formed.

Figure 4:
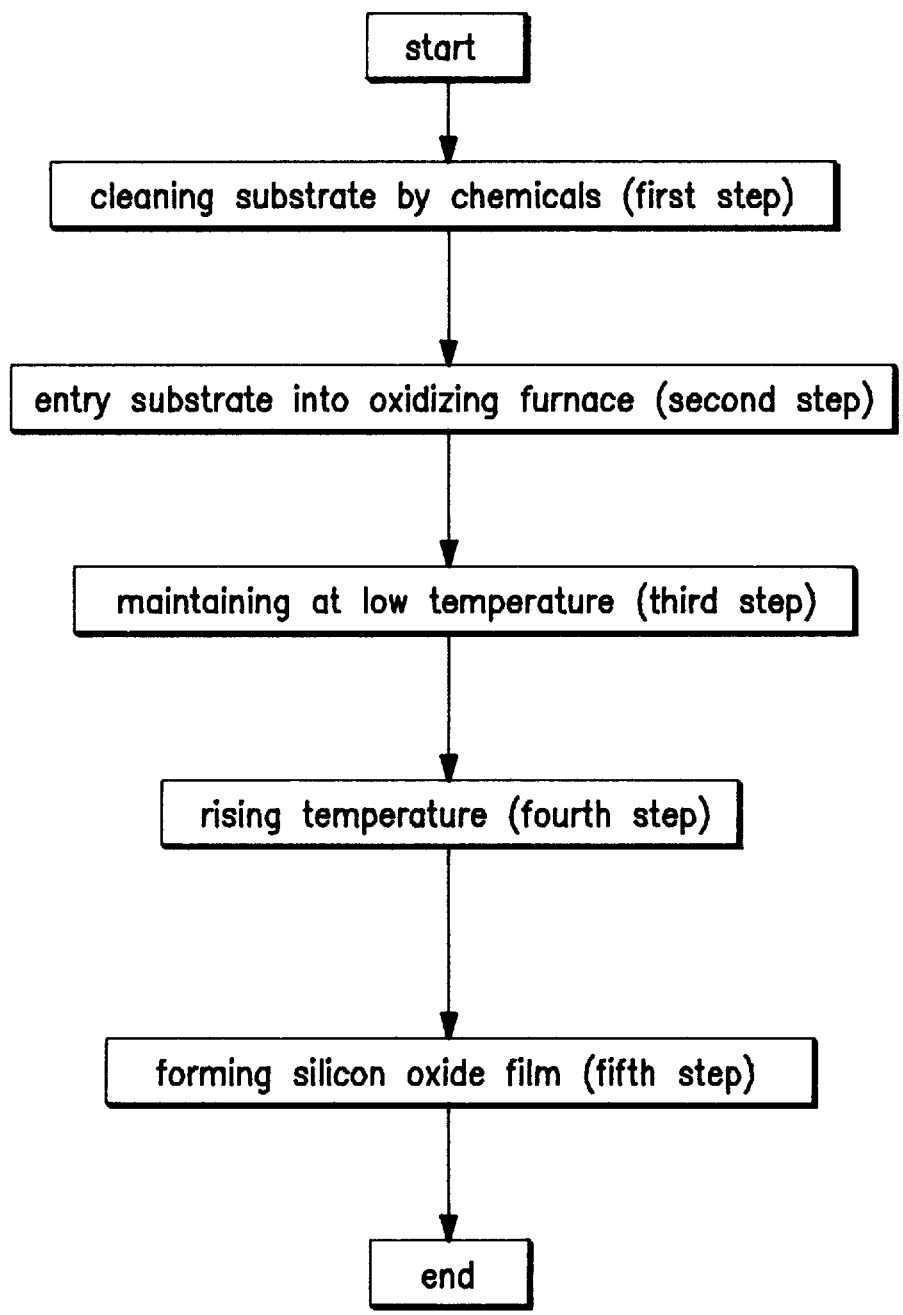
FIG. 4 is a flow chart illustrative of a novel method of cleaning the surface of the silicon substrate in a third embodiment according to the present invention.
Figure 5:
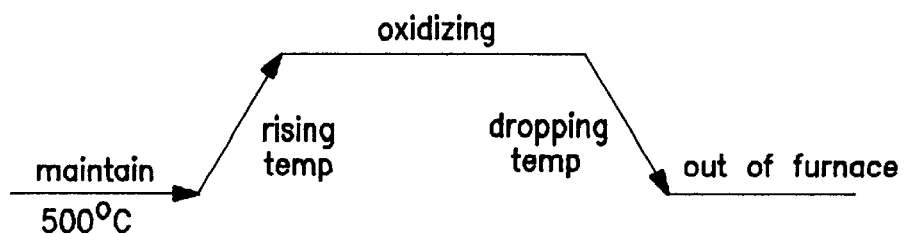
FIG. 5 is a diagram illustrative of variation in temperature of a silicon substrate in a process involved in a novel method of cleaning the surface of the silicon substrate in a third embodiment according to the present invention.

A third embodiment according to the present invention will be described in detail with reference to FIGS. 4 and 5, wherein a novel method of cleaning a surface of a silicon substrate before a thermal oxidation is carried out to form a silicon oxide film on the surface of the silicon substrate.

In the first step, a silicon substrate such as a silicon-on-insulating substrate is cleaned with chemicals. As the chemicals, hydrofluoric acid solution, a solution including hydrochloric acid and hydrogen peroxide, and a solution including ammonia water and hydrogen peroxide water. The cleaning by use of the chemicals removes majority of particles and metal impurities from the surface of the silicon-on-insulating substrate.

In the second step, the silicon-on-insulating substrate is placed in an oxidizing furnace filled with an argon gas to prevent any silicon oxide film from being grown on the surface of the silicon substrate. Introduction of the argon gas is continued. The oxidizing furnace is maintained at a temperature of 500° C.

In the third step, the silicon-on-insulating substrate remains placed in the argon gas atmosphere in the furnace for a predetermined time, for example, 60 minutes at the temperature of 500° C. for the purpose of cleaning the surface of the silicon substrate.

In the fourth step, after the necessary time predetermined has passed, the temperature of the silicon-on insulating substrate is increased to 800° C. while the atmosphere in the furnace remains the argon gas atmosphere. The rate of the temperature increase is 5° C./min.

In the fifth step, an oxygen gas is introduced into the oxidizing furnace so that the argon gas atmosphere in the furnace is replaced into the oxygen atmosphere. A thermal oxidation is carried out at a temperature of 800° C. to form a silicon oxide film on the surface of the silicon substrate. After the above thermal oxidation process has been carried out for cleaning the surface of the silicon-on-insulating substrate, then the temperature of the furnace is dropped to 500° C. The silicon-on-insulating substrate on which the silicon oxide film is formed is then put out of the furnace.

According to the above third embodiment, it is possible to process a large number of silicon substrates by the inexpensive oxidizing furnace safely.

The above novel method of cleaning the surface of the silicon substrate allows a reduction in the number of the processes, resulting in a reduction in the manufacturing cost.

The above novel method of cleaning the surface of the silicon substrate is further free from the problem with the generation of crystal defects such as slip dissociation in the silicon substrate.

In the third embodiment, the temperature of the furnace processing is set as low as possible in view of prevention of any silicon nitride film on a silicon substrate.

The above novel method of cleaning the surface of the silicon substrate facilitates cleaning the surface of the silicon-on-insulating substrate or facilitates removal of heavy metal from the surface of the silicon-on-insulating substrate.

Figure 6:
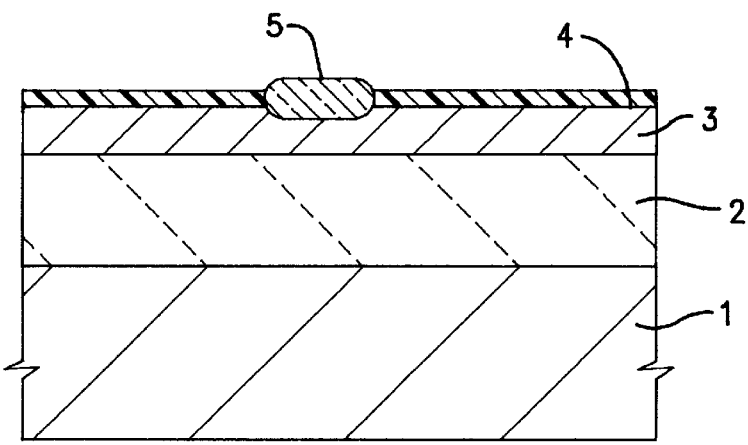
FIG. 6 is a fragmentary cross sectional elevation view illustrative of a silicon-on-insulation substrate on which an anomalous oxide is formed.

FIG. 6 illustrates a silicon-on-insulating substrate on which an anomalous oxide is formed. A silicon oxide film 2 having a thickness of 500 nanometers is formed on a silicon substrate 1. A mono-crystal silicon film 3 having a thickness of 100 nanometers is formed on the silicon oxide film 2 to thereby form a silicon-on-insulating substrate.

Figure 7:
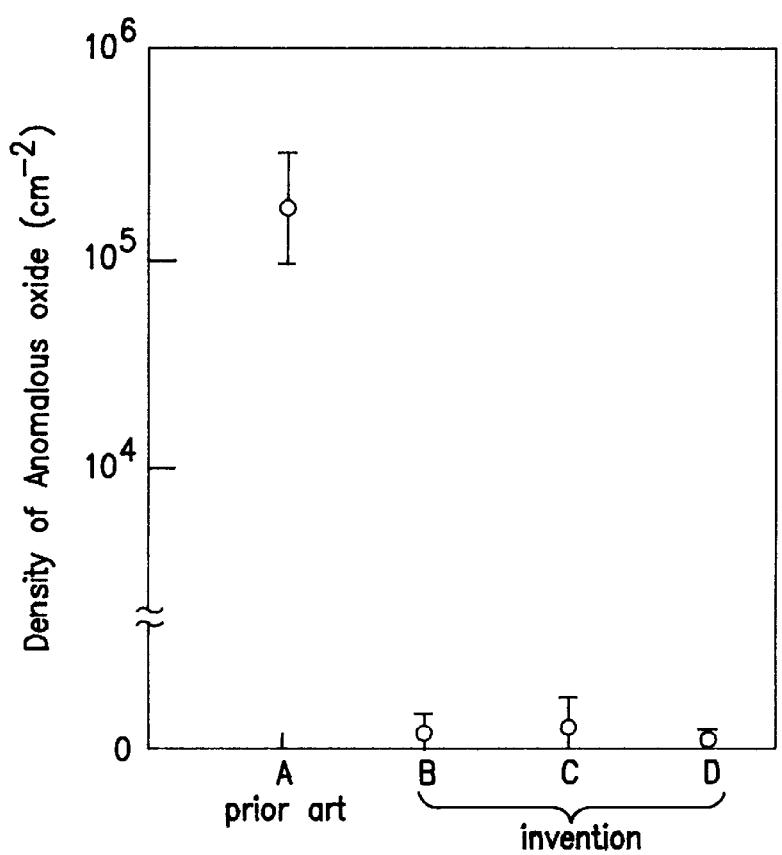
FIG. 7 is a diagram illustrative of densities of anomalous oxide formed on a silicon-on-insulation substrate when the conventional and novel methods of cleaning the surface of the substrate are used.

A silicon dioxide film 4 is then formed by a thermal oxidation of silicon on a surface of the mono-crystal silicon film 3 of the silicon-on-insulating substrate. In this thermal oxidation process, not only the above intended silicon dioxide film 4 but also an anomalous oxide 5 are formed. The density of such anomalous oxide 5 on the surface of the silicon-on-insulation film is relevant to the degree of contamination of the surface of the silicon-on-insulating substrate before the silicon dioxide film is then formed by the thermal oxidation of silicon. Evaluation of the effect of cleaning the surface of the silicon-on-insulation substrate can be made by measuring the anomalous oxide 5. FIG. 7 illustrates the density of the anomalous oxide 5 on the surface of the silicon-on-insulation substrate having been cleaned by the conventional cleaning method, and the novel methods in the first, second and third embodiments. "A" represents the non-cleaning method. "B" represents the novel method in the first embodiment. "C" represents the novel method in the second embodiment. "D" represents the novel method in the third embodiment. Before the cleaning process, the surface of the silicon--on-insulating substrate is contaminated with copper at $1\times10^{13}$ cm$^{-2}$. The thermal oxidation is carried out at a temperature of 800° C. for 30 minutes. If the present invention is not applied, then the density of anomalous oxide 5 formed on the surface of the silicon-on-insulation substrate is so high, for example, over $1\times10^5$ cm$^{-2}$. By contrast, if the present invention is applied, then almost no anomalous oxide 5 is formed on the surface of the silicon-on-insulation substrate in each of the above first, second and third embodiments according to the present invention.

As modifications of the present invention, the above novel method may be applied to clean the surface of a compound semiconductor substrate. Helium gas is also available preferably.

The above novel method may be applied to when the silicon oxide film which extends over the semiconductor substrate be formed not only by the thermal oxidation of silicon but also by any other processes such as chemical vapor deposition method.

The above novel method may be applied to when any other film is formed on the surface of the semiconductor substrate.

The above novel method may be available provided that the temperature of the growth of the film on the surface of the semiconductor substrate is lower than a temperature at which the heat treatment is carried out in the atmosphere comprising one or more of the inert gases and the nitrogen gas for cleaning the surface of the semiconductor substrate.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of cleaning and oxidizing a surface of a silicon-on-insulator semiconductor comprising the steps of:

washing the semiconductor surface with chemicals to remove particles and metal impurities from the surface;

inserting the semiconductor into a furnace that has an atmosphere of a first gas to prevent formation of an oxide film on the surface;

replacing the first gas mixture of the furnace with argon;

removing particles and metal impurities from the surface that were not removed by the washing step by heating the furnace containing said argon to a first temperature for a first period of time;

replacing said argon contained in the furnace with an oxygen gas; and thermally oxidizing the surface in the furnace to form an oxide film on the surface.

2. The method of claim 1, wherein said second inert gas of said first gas mixture is argon.

3. The method of claim 1, further comprising the step of maintaining the first temperature during the step of replacing said argon with said oxygen gas.

4. The method of claim 2, wherein the first temperature is from 800° C. to 900° C. and the first period of time is 20 minutes.

* * * * *